(12) United States Patent
Kim et al.

(10) Patent No.: US 9,753,314 B2
(45) Date of Patent: Sep. 5, 2017

(54) DISPLAY APPARATUS

(71) Applicant: Samsung Display Co., LTD., Yongin, Gyeonggi-Do (KR)

(72) Inventors: Won-Seok Kim, Ansan-si (KR); Toru Tsunekawa, Cheonan-si (KR); Yong-Woo Lee, Suwon-si (KR)

(73) Assignee: Samsung Display Co., Ltd. (KR)

( * ) Notice: Subject to any disclaimer, the term of this patent is extended or adjusted under 35 U.S.C. 154(b) by 116 days.

(21) Appl. No.: 14/459,177

(22) Filed: Aug. 13, 2014

(65) Prior Publication Data
US 2015/0286087 A1    Oct. 8, 2015

(30) Foreign Application Priority Data

Apr. 2, 2014  (KR) .................. 10-2014-0039153

(51) Int. Cl.
| | | |
|---|---|---|
| G02F 1/1333 | (2006.01) | |
| G02F 1/1343 | (2006.01) | |
| F21V 8/00 | (2006.01) | |
| H05K 1/02 | (2006.01) | |

(52) U.S. Cl.
CPC ..... G02F 1/133308 (2013.01); G02B 6/0066 (2013.01); G02B 6/0088 (2013.01); G02F 1/13439 (2013.01); *G02F 2001/133317* (2013.01); *H05K 1/028* (2013.01); *H05K 2201/10136* (2013.01)

(58) Field of Classification Search
CPC .......... G02F 1/133308; G02F 1/13439; G02F 2001/133317; H05K 1/189; H05K 2201/10136; H05K 1/028; G02B 6/0066; G02B 6/0088

USPC ........................................... 349/58
See application file for complete search history.

(56) References Cited

U.S. PATENT DOCUMENTS

| | | | |
|---|---|---|---|
| 7,775,701 B2 | 8/2010 | Lee et al. | |
| 7,872,704 B2 | 1/2011 | Ooami | |
| 8,368,836 B2 | 2/2013 | Kim et al. | |
| 2007/0103915 A1* | 5/2007 | Chang | G02F 1/133608 362/374 |
| 2009/0004408 A1* | 1/2009 | Nakanishi | G02F 1/133308 428/12 |
| 2009/0079894 A1* | 3/2009 | Okuda | G02F 1/133308 349/58 |
| 2012/0285637 A1* | 11/2012 | Kasuya | B41F 15/36 160/369 |
| 2013/0208510 A1 | 8/2013 | Takashima et al. | |
| 2013/0258229 A1 | 10/2013 | Kuo et al. | |

FOREIGN PATENT DOCUMENTS

| | | |
|---|---|---|
| KR | 10-2005-0093882 | 9/2005 |
| KR | 10-2007-0095017 | 9/2007 |
| KR | 10-2013-0122882 | 11/2013 |

* cited by examiner

*Primary Examiner* — Charles Chang
(74) *Attorney, Agent, or Firm* — Innovation Counsel LLP

(57) ABSTRACT

A display apparatus includes a display panel configured to display an image, a lower receiving container comprising a bottom portion and a side wall and accommodating the display panel and a mold frame integrally formed with the lower receiving container, extending along the side wall of the lower receiving container, and comprising a plurality of groove portions extending from an inner surface of the mold frame toward an outer surface of the mold frame.

9 Claims, 12 Drawing Sheets

DISPLAY APPARATUS

PRIORITY STATEMENT

This application claims priority under 35 U.S.C. §119 to Korean Patent Application No. 10-2014-0039153, filed on Apr. 2, 2014 in the Korean Intellectual Property Office KIPO, the contents of which are herein incorporated by reference in their entireties.

BACKGROUND

1. Field

The present inventive concept relates to a display apparatus. More particularly, the present inventive concept relates to a display apparatus capable of preventing light-leakage.

2. Description of the Related Art

Recently, flat panel display apparatuses that can decrease a weight and a volume and overcome the limitations of Cathode Ray Tubes (CRTs) are being developed. Liquid Crystal Display (LCD), Plasma Display panels (PDPs), Field Emission Display Device (FED) and Light Emitting Display Device are actively being researched as flat type display apparatuses. However, among such flat display apparatuses, Liquid Crystal Display are easily manufactured, have good drivability of drivers, realize a high-quality image, and thus are attracting much attention.

Recently, research and development of flat panel display apparatus which attract consumer's attention in terms of technology and design are increasingly required. Therefore, requirements for reducing the thickness and enhancing the sense of beauty become increasingly important to meet the requirements of consumers.

However, effort for reducing the thickness and enhancing the sense of beauty has a limitation because the effort is focused on changing the structure of existing elements.

Recently, a backlight assembly having a slim thickness has been developed. However, when adopting the backlight assembly having a slim thickness, overall strength of a display apparatus may be decreased. Thus, the display apparatus may be bent.

Accordingly, an insert molding which integrates a mold frame and a bottom chassis has been used in order to increase strength of a product.

SUMMARY

Exemplary embodiments of the present inventive concept provide a backlight assembly capable of having long lifespan without an increase of a manufacturing cost.

Exemplary embodiments of the present inventive concept also provide a display apparatus including the backlight assembly.

In an exemplary embodiment of a display apparatus according to the present inventive concept, the display apparatus includes a display panel configured to display an image, a lower receiving container comprising a bottom portion and a side wall and accommodate the display panel and a mold frame integrally formed with the lower receiving container, extending along the side wall of the lower receiving container, and comprising a plurality of groove portions extending from an inner surface of the mold frame toward an outer surface of the mold frame.

In an exemplary embodiment, the mold frame may include a side wall portion engaged with the side wall of the lower receiving container and a supporting portion extending from the side wall portion to support the display panel.

In an exemplary embodiment, the supporting portion may have a thick portion and a thin portion, the thin portion being disposed between the groove portion and the bottom portion of the lower receiving container.

The groove portions may extend substantially perpendicular to the side wall of the lower receiving container.

The groove portions may extend obliquely from the side wall of the lower receiving container In an exemplary embodiment, the groove portion may expose the bottom portion of the lower receiving container.

In an exemplary embodiment of a display apparatus according to the present inventive concept, the display apparatus includes a display panel configured to display an image, a lower receiving container comprising a bottom portion and a side wall and accommodating the display panel and a mold frame integrally formed with the lower receiving container, the mold frame comprising a plurality of sub-mold frames spaced apart from each other. Each of the plurality of sub-mold frame includes an outer surface extending along the side wall of the lower receiving container and a cutting surface facing a cutting surface of an adjacent sub-mold frame. The cutting surface is inclined to the outer surface.

In an exemplary embodiment, the cutting surface may be inclined to the outer surface as an acute angle or an obtuse angle.

In an exemplary embodiment, the cutting surface may include two vertical portions extending in a vertical direction with respect to the outer surface and an inclined portion connecting the two vertical portions.

In an exemplary embodiment, the cutting surface may have a clamp shape.

In an exemplary embodiment, the cutting surface may have a bent portion at a center of the cutting surface.

In an exemplary embodiment, the cutting surface may include a plurality of cutting surfaces, the plurality of cutting surfaces extending parallel to each other.

In an exemplary embodiment, the display apparatus may further include a light source unit disposed between the display panel and the lower receiving container.

In an exemplary embodiment, the lower receiving container may include metal and the mold frame comprises polymer.

In an exemplary embodiment, the mold frame may include two shorter sides opposing to each other and a longer side connecting the two shorter sides.

In an exemplary embodiment, the mold frame may include at least one selected from the group consisting of polymethyl methacrylate and polycarbonate.

According to the present inventive concept as explained above, the mold frame according to the present exemplary embodiment has the groove portion, so that a warping of the lower receiving container may be prevented despite the contraction of the mold frame. In addition, the side wall portion of the mold frame is not removed entirely. Accordingly, an optical path is not formed in the side wall portion of the mold frame. Therefore, a light-leakage or a dark spot may not be occurred in a display apparatus.

In addition, the mold frame may include a plurality of sub-mold frames spaced apart from each other, so that a warping of the lower receiving container may be prevented despite the contraction of the mold frame. In addition, a first cutting surface of a first sub-mold frame and a second cutting surface of a second sub-mold frame may have an angle of inclination with respect to an outer surface of the mold frame. Thus, the first sub-mold frame and the second sub-mold frame may have an overlapping region in a vertical direction with respect to the outer surface of the mold frame. Accordingly, the overlapping region may block a vertical light with respect to the outer surface of the mold frame. Therefore, a light-leakage or a dark spot may not be occurred in a display apparatus.

BRIEF DESCRIPTION OF THE DRAWINGS

The above and other features and advantages of the present inventive concept will become more apparent by describing in detailed exemplary embodiments thereof with reference to the accompanying drawings, in which.

DETAILED DESCRIPTION OF THE INVENTIVE CONCEPT

Hereinafter, the inventive concept will be explained in detail with reference to the accompanying drawings.

Figure 1:
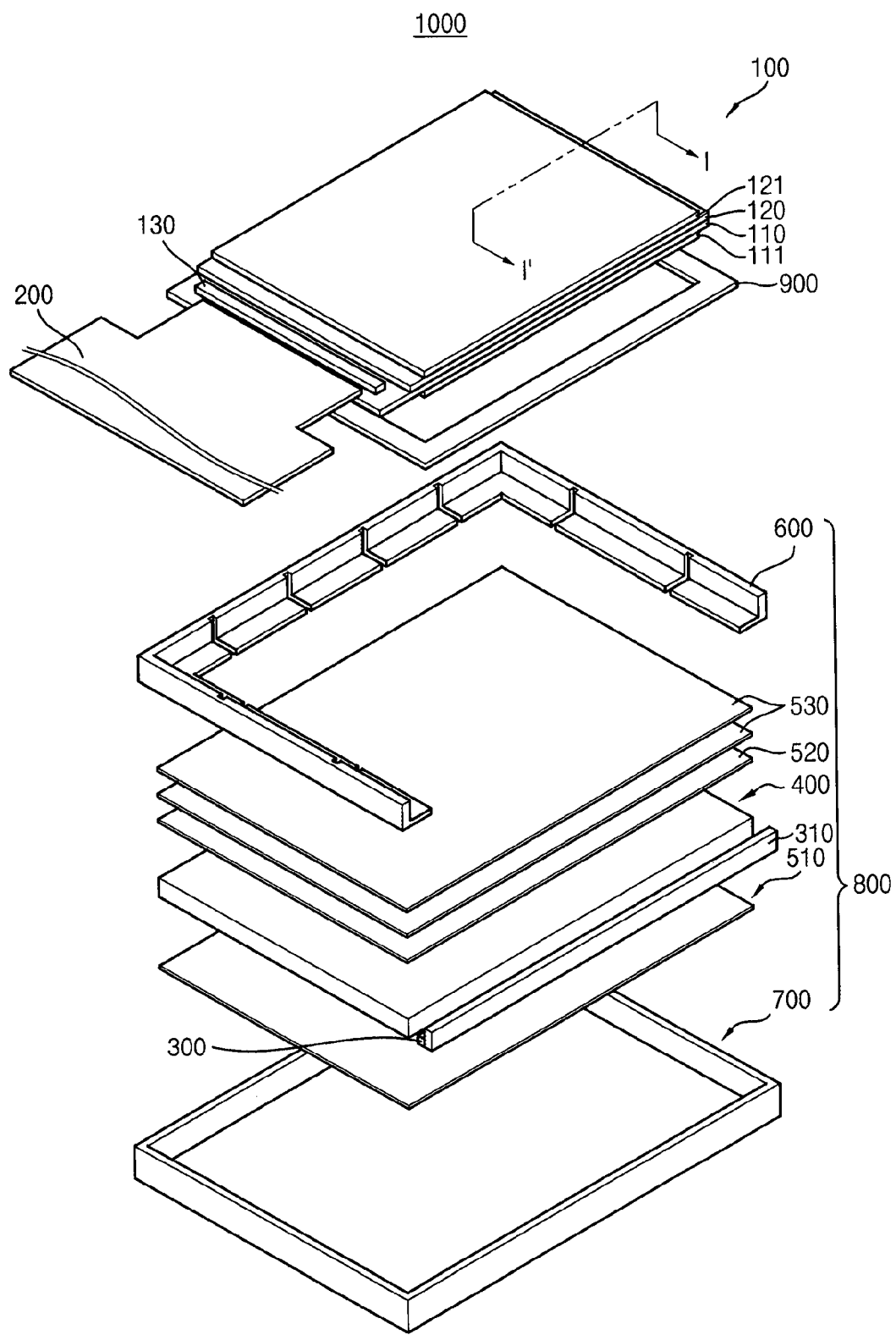
FIG. 1 is an exploded perspective view illustrating an exemplary embodiment of display apparatus according to the inventive concept.
Figure 2:
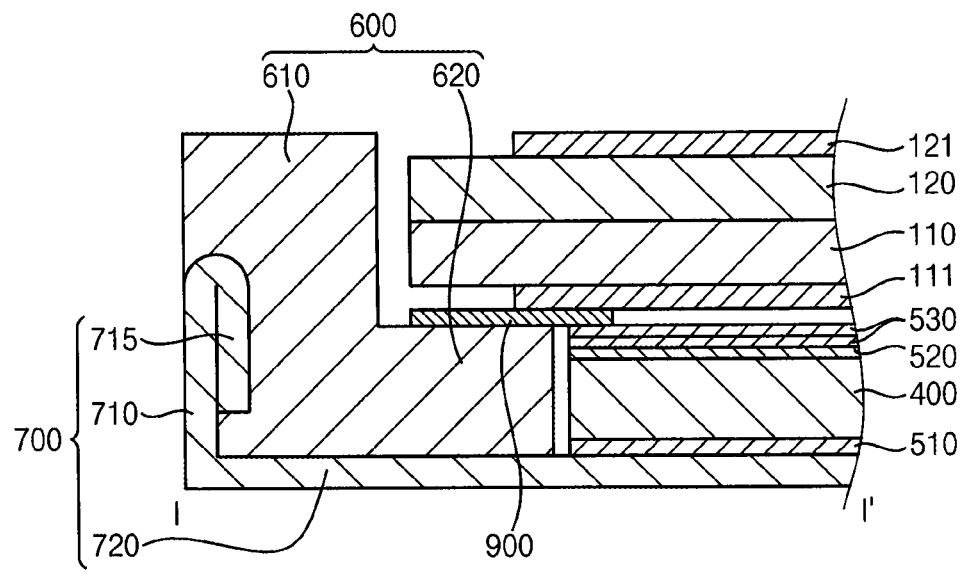
FIG. 2 is a cross-sectional view taken along line I-I' of FIG. 1.

FIG. 1 is an exploded perspective view illustrating an exemplary embodiment of display apparatus according to the inventive concept. FIG. 2 is a cross-sectional view taken along line I-I' of FIG. 1.

Referring to FIGS. 1 and 2, a display apparatus 1000 according to an exemplary embodiment of the inventive concept includes a display panel 100 displaying an image, a main flexible printed circuit board 200 electrically connected to the display panel 100 and a backlight assembly 800 supplying light to the display panel 100.

The display panel 100 includes a first substrate 110, a second substrate 120 facing the first substrate 110, a liquid crystal layer disposed between the first substrate 110 and the second substrate 120, a first polarizing film 111 disposed on a lower surface of the first substrate 110 and a second polarizing film 121 disposed on an upper surface of the second substrate 120. An image is displayed on the display panel 100 using a light from the backlight assembly 800.

The first substrate 110 may include a thin film transistors formed in a matrix configuration. A source electrode of the thin film transistor is electrically connected to a date line. A gate electrode of the thin film transistor is electrically connected to a gate line. A drain electrode of the thin film transistor is electrically connected to a pixel electrode. The pixel electrode may be formed of transparent conductive material. For example, the pixel electrode may include a transparent conductive material, such as indium tin oxide (ITO), indium zinc oxide (IZO), etc. In addition, the pixel electrode may include titanium (Ti) and/or molybdenum titanium (MoTi).

The second substrate 120 faces the first substrate 110. The second substrate 120 may include a color filter that colors the pixel. The second substrate 120 may include a common electrode. The common electrode may face the pixel electrode. The common electrode may be formed of transparent conductive material. For example, the common electrode may include a transparent conductive material, such as indium tin oxide (ITO), indium zinc oxide (IZO), etc. In addition, the common electrode may include titanium (Ti) and/or molybdenum titanium (MoTi).

When the thin film transistor is turned on by applying turn-on voltage to the gate of the thin film transistor, the electric field is formed between the pixel electrode and the common electrode. The electric field alters an aligning angle of the liquid crystal molecules of the liquid crystal layer disposed between the first substrate 110 and the second substrate 120. Thus, a light transmittance of the liquid crystal layer is varied in accordance with the alteration of the aligning angle of the liquid crystal, so a desired image may be displayed on the display apparatus 1000.

The first polarizing film 111 may be disposed on a lower surface of the first substrate 110. The first polarizing film 111 may have a first polarization axis. The first polarizing film 111 may polarize light in a first direction.

The second polarizing film 121 may be disposed on an upper surface of the second substrate 120. The second polarizing film 121 may have a second polarization axis. The second polarizing film 121 may polarize light in a second direction crossing the first direction. For example, the first polarization axis may be perpendicular to the second polarization axis.

The display panel 100 may further include a driving chip 130. The driving chip 130 may drive the first substrate 110. The driving chip 130 generates a driving signal driving the first substrate 110 in response to a control signal applied from other elements. In the present exemplary embodiment, the driving chip 130 may be disposed at an end of the first substrate 110. For example, the driving chip 130 may be electrically connected to the first substrate 110 by a chip on glass (COG) process.

The main flexible printed circuit board 200 is electrically connected to an end of the first substrate 110 to apply a control signal to the display panel 100. For example, the main flexible printed circuit board 200 may be electrically connected to the first substrate 110 by a film on glass (FOG) process. In the present exemplary embodiment, the main flexible printed circuit board 200 is connected to the end of the first substrate 110 and bent to a lower surface of the display panel 100. For example, the main flexible printed circuit board 200 may be formed of a resin having flexibility.

The backlight assembly 800 is disposed under the display panel 100. The backlight assembly 800 includes a light source unit generating light, a mold frame 600 covering an outside of the light source unit and a lower receiving container 700 covering an outside of the mold frame 600 and integrally formed with the mold frame 600. Although the mold frame 600 is integrally formed with the lower receiving container 700, the mold frame 600 and the lower receiving container 700 illustrated in FIG. 1 are separated from each other for convenience of explanation.

The light source unit may include a flexible printed circuit board 310, a light source 300, a light guide plate 400 and a plurality of optical sheets.

The flexible printed circuit board 310 may provide the light source 300 disposed thereon with driving power. In the present exemplary embodiment, the flexible printed circuit board 310 may be disposed under the first substrate 110 to be corresponded to an end of the display panel 100. For example, the flexible printed circuit board 310 may be formed of a resin having flexibility. The flexible printed circuit board 310 may include a metal line disposed thereon.

The light source 300 disposed on the flexible printed circuit board 310 to generate light. In the present exemplary embodiment, the light source 300 may be mounted on the flexible printed circuit board 310. For example, the light source 300 may include a light emitting diode (LED) emitting a white light. The number of the light sources 300 may be determined in consideration of size and brightness of the display panel 100. In the present exemplary embodiment, the flexible printed circuit board 310 and the light source 300 may face a side surface of the light guide plate 400.

The light guide plate 400 may be disposed under the display panel 100. The light guide plate 400 may be formed as a plate shape. The light guide plate 400 may be disposed adjacent to the light source 300 to face a light exit surface of the light source 300. The light guide plate 400 may include a groove (not shown). The light source 300 is inserted into the groove (not shown), so that a loss of light may be decreased. The light guide plate 400 guides light emitted from the light source 300 toward the display panel 100.

The light guide plate 400 includes a transparent material to minimize a loss of light from the light source 300. For example, the light guide plate 400 may include a material having superior strength, such as polymethylmethacrylate (PMMA).

In order to reduce a thickness of the light guide plate 400, the light guide plate 400 may include polycarbonate (PC). The polycarbonate is inferior in strength to the polymethylmethacrylate, but the polycarbonate is superior in heat-resistance to the polymethymethacrylate.

The optical sheets may improve luminance characteristics of light emitted from the light guide plate 400. The optical sheets may include a reflecting sheet 510, a diffusion sheet 520 and a prism sheet 530.

The reflecting sheet 510 may be disposed under the light guide plate 400. The reflecting sheet 510 reflects light leaked through a lower surface of the light guide plate 400 back to the light guide plate 400, so that light efficiency is enhanced.

The diffusion sheet 520 may be disposed on the light guide plate 400. The diffusion sheet 520 may diffuse light exiting from the light guide plate 400.

The prism sheet 530 may be disposed on the diffusion sheet 520. The prism sheet 530 may condense light exiting from the light guide plate 400. For example, the prism sheet 530 may include a vertical prism sheet condensing light in a vertical direction and a horizontal prism sheet condensing light in a horizontal direction.

The mold frame 600 may enclose the light source unit to expose a lower surface of the light source unit. The mold frame 600 may be engaged with the display panel 100 disposed over the light source unit. The mold frame 600 may include two shorter sides opposing to each other and a longer side connecting the two shorter sides, but not limited thereto. The mold frame 600 may be formed as a frame shape.

The mold frame 600 may be formed with a polymer. For example, the mold frame 600 may include a material having superior strength, such as polymethylmethacrylate (PMMA).

In order to reduce a thickness of the mold frame 600, the mold frame 600 may include polycarbonate (PC). The polycarbonate is inferior in strength to the polymethylmethacrylate, but the polycarbonate is superior in heat-resistance to the polymethymethacrylate.

The mold frame 600 may include a side wall portion 610 and a supporting portion 620. The side wall portion 610 may surround an edge of the display panel 100 and extend along the side wall of the lower receiving container 700. The supporting portion 620 may extend from the side wall portion 610 toward in an inner direction of the receiving container 700. An edge of the display panel 100 may be disposed on the supporting portion 620. A height of the supporting portion 620 may be the same as a height of the light source unit. The supporting portion 620 may guide and support the edge of the display panel 100.

The mold frame 600 according an exemplary embodiment of the inventive concept may be formed by an insert injection molding process. The mold frame 600 may be integrally formed with the lower receiving container 700. The mold frame 600 is connected to the lower receiving container 700 with no mechanical joints. Thus, the mold frame 600 and the lower receiving container 700 may be formed to have a thin thickness.

The mold frame 600 may include a plurality of groove portions H. The groove portion H may extend from an inner surface of the mold frame 600 toward an outer surface of the mold frame 600. For example, the groove portion H may expose the bottom portion of the lower receiving container 700. However, the groove portion H may not expose the bottom portion of the lower receiving container 700. That is, the supporting portion 620 has a thick portion and a thin portion. The thin portion is disposed between the groove portion and the bottom portion of the lower receiving container.

The mold frame 600 may be formed on the lower receiving container 700 by an insert injection molding process. Thus, the mold frame 600 is integrally formed with the lower receiving container 700. Without the groove portion H, when the mold frame 600 is shrunk after the insert injection molding process, the lower receiving container 700 may be warped. However, the mold frame 600 according to the present exemplary embodiment has the groove portion H, so that a warping of the lower receiving container 700 may be prevented despite the contraction of the mold frame 600.

The groove portion H is partially formed in the side wall portion 610 of the mold frame 600. That is, the side wall portion 610 of the mold frame 600 is not removed entirely. Accordingly, an optical path is not formed in the side wall portion 610 of the mold frame 600. Therefore, a light-leakage or a dark spot may not be occurred in a display apparatus.

The lower receiving container 700 may accommodate the light source unit. The lower receiving container 700 may include a material having superior strength, such as metal. For example, the lower receiving container 700 may be a metal chassis.

The lower receiving container 700 may be integrally formed with the mold frame 600. The mold frame 600 may be formed on the lower receiving container 700 by an insert injection molding process. After the lower receiving container 700 is installed in a mold manufacturing apparatus having die, mold forming material is inserted into the die. Thus, the mold frame 600 may be directly formed on the lower receiving container 700 with no mechanical joint. When a mold frame and a lower receiving container are manufactured using a conventional method, a gap between the mold frame and the lower receiving container may be generated. However, the mold frame 600 according to the present exemplary embodiment is directly formed on the lower receiving container 700, so that a gap between the mold frame and the lower receiving container may be minimized.

The lower receiving container 700 may include a side portion 710, a bottom portion 720 and a bending portion 715. The bending portion 715 may be formed inside of the side portion 710 of the lower receiving container 700. The bending portion 715 may enhance an adhesion between the mold frame 600 and the lower receiving container 700.

The bending portion 715 may extend from the side wall of the lower receiving container 700. The bending portion 715 is bent toward a bottom portion 720 of the lower receiving container 700. For example, the bending portion 715 may be formed by hemming. The bending portion 715 may have a "U" shape in a cross-sectional view.

The mold frame 600 and the lower receiving container 700 may be integrally formed. For example, a lower surface of the mold frame 600 may directly contact an upper surface of the bottom portion 720 of the lower receiving container 700. An inner surface of the side wall of the lower receiving container 700 may directly contact a side surface of the mold frame 600. An upper surface of the wall of the lower receiving container 700 may be covered with the mold frame 600.

The bending portion 715 according to the present exemplary embodiment may enhance an adhesion between the mold frame 600 and the lower receiving container 700. Thus, an assembly quality between the mold frame 600 and the lower receiving container 700 may be improved.

The display apparatus 1000 may include a bonding sheet 900. The bonding sheet 900 may be disposed on the supporting portion 620 of the mold frame 600 to be overlapped with an edge of the optical sheet. The bonding sheet 900 may have a frame shape. The bonding sheet 900 may bond a lower surface of the display panel 100 on an upper surface of the supporting portion 620 of the mold frame 600. For example, the bonding sheet 900 may be formed as a double-sided tape.

Figure 3:
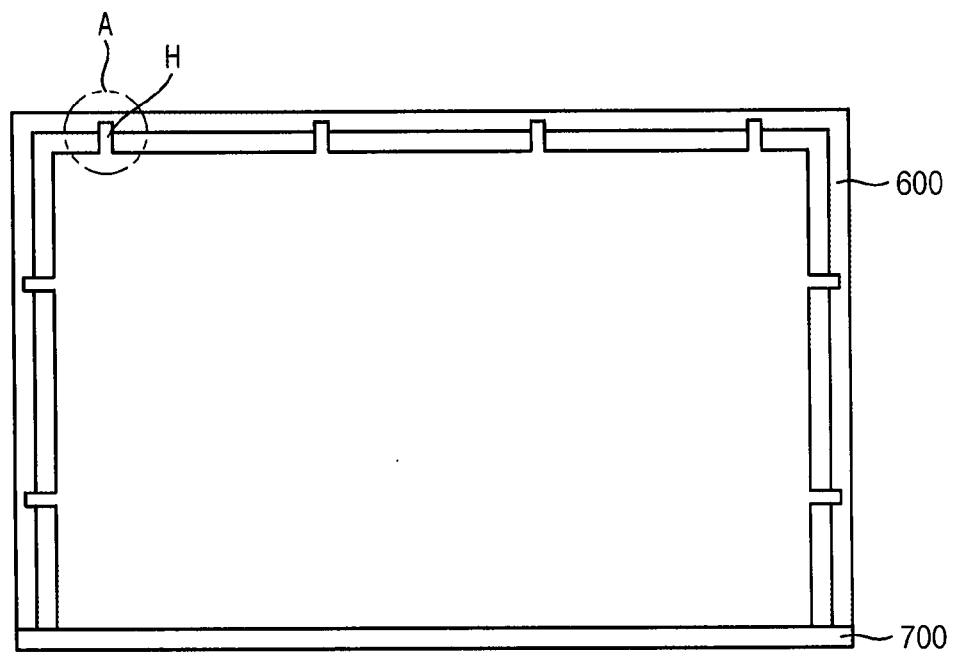
FIG. 3 is a plan view illustrating an exemplary embodiment of mold frame and lower receiving container according to the inventive concept.
Figure 4:
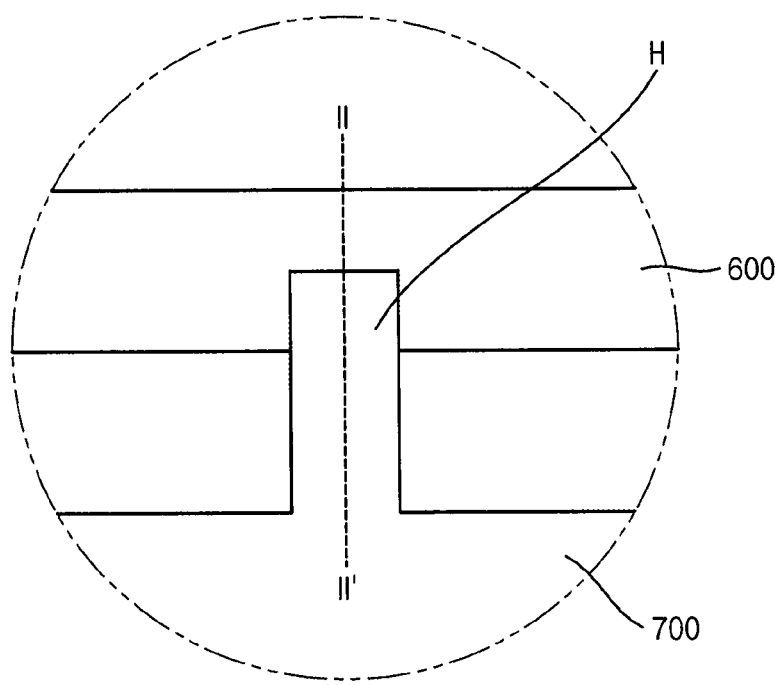
FIG. 4 is a plan view magnifying "A" portion of FIG. 3.
Figure 5:
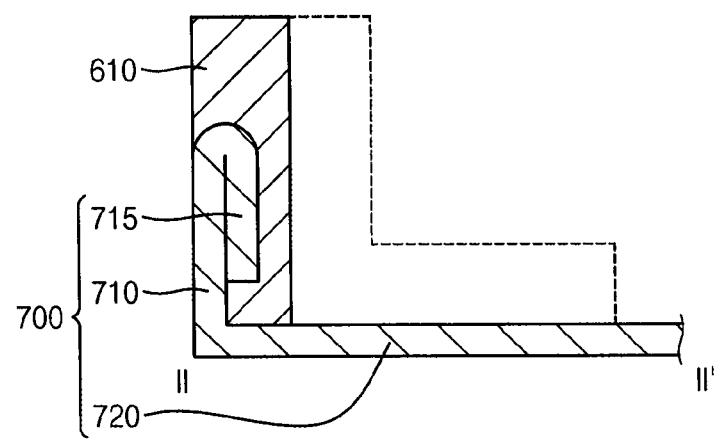
FIG. 5 is a cross-sectional view taken along line II-II' of FIG. 4.

FIG. 3 is a plan view illustrating an exemplary embodiment of the mold frame 600 and the lower receiving container 700 according to the inventive concept. FIG. 4 is a plan view magnifying "A" portion of FIG. 3. FIG. 5 is a cross-sectional view taken along line II-II' of FIG. 4.

Referring to FIGS. 3 to 5, the mold frame 600 according to the present exemplary embodiment may be formed on the lower receiving container 700 by an insert injection molding process. Thus, the mold frame 600 is integrally formed with the lower receiving container 700. The mold frame 600 may include two shorter sides opposing to each other and a longer side connecting the two shorter sides. For example, the mold frame 600 may be formed as a frame shape formed with three sides. A flexible printed circuit board (refers 310 of FIG. 1) and a light source (refers 300 of FIG. 1) may be disposed at a longer side at which the mold frame 600 is not formed.

The mold frame 600 may include a plurality of groove portions H. The mold frame 600 may be formed on the lower receiving container 700 by an insert injection molding process. Thus, the mold frame 600 is integrally formed with the lower receiving container 700. Without the plurality of groove portions H, when the mold frame 600 is shrunk after the insert injection molding process, the lower receiving container 700 may be warped. However, the mold frame 600 according to the present exemplary embodiment has the groove portion H, so that a warping of the lower receiving container 700 may be prevented despite the contraction of the mold frame 600.

The groove portion H may extend vertically with respect to an outer surface of the mold frame 600. The groove portion H is partially formed in the side wall portion 610 of the mold frame 600. That is, the side wall portion 610 of the mold frame 600 is not removed entirely. The groove portion H may expose the bottom portion of the lower receiving container 700. Thus, the supporting portion 620 of the mold frame 600 is removed entirely in the groove portion H in a plan view.

When the side wall portion 610 of the mold frame 600 is removed entirely, a light may be leaked through the groove portion H. Accordingly, a light-leakage or a dark spot may be occurred in a display apparatus. However, the groove portion H according to the present exemplary embodiment is partially formed in the side wall portion 610 of the mold frame 600. That is, the side wall portion 610 of the mold frame 600 is not removed entirely. Accordingly, an optical path is not formed in the side wall portion 610 of the mold frame 600. Therefore, a light-leakage or a dark spot may not be occurred in a display apparatus.

Figure 6:
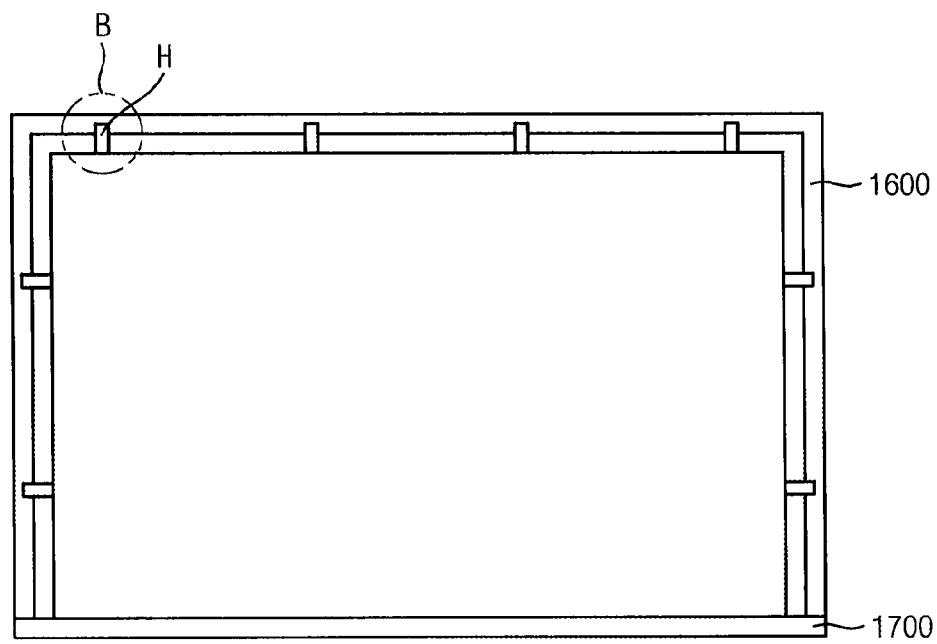
FIG. 6 is a plan view illustrating an exemplary embodiment of mold frame and lower receiving container according to the inventive concept.
Figure 7:
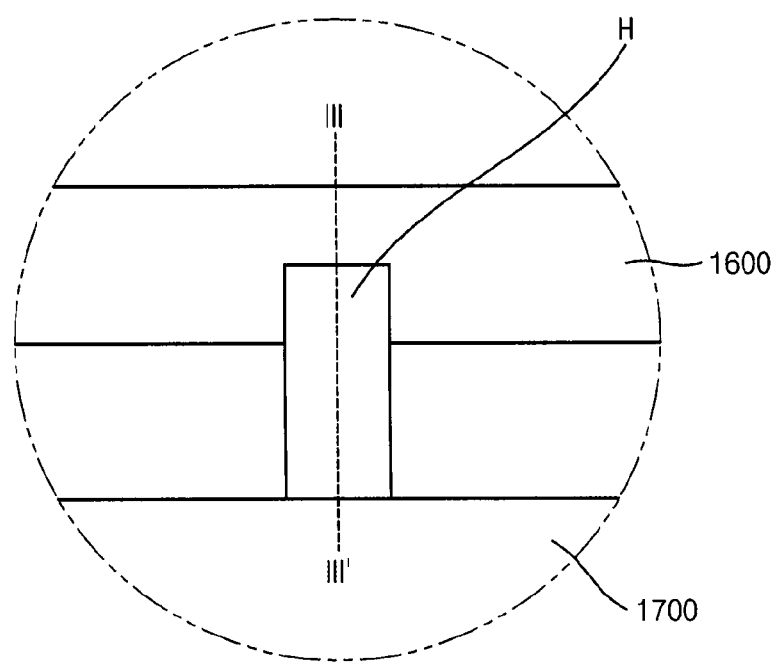
FIG. 7 is a plan view magnifying "B" portion of FIG. 6.
Figure 8:
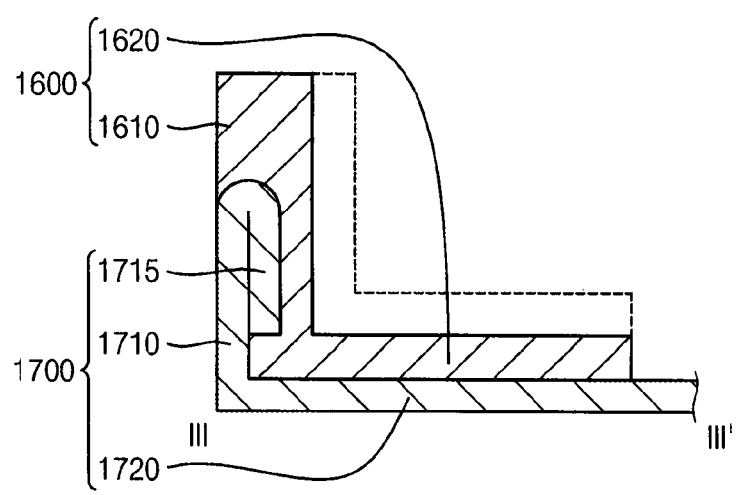
FIG. 8 is a cross-sectional view taken along line III-III' of FIG. 7.

FIG. 6 is a plan view illustrating an exemplary embodiment of mold frame and lower receiving container according to the inventive concept. FIG. 7 is a plan view magnifying "B" portion of FIG. 6. FIG. 8 is a cross-sectional view taken along line III-III' of FIG. 7.

Referring to FIGS. 6 to 8, the mold frame 1600 according to the present exemplary embodiment may be formed on the lower receiving container 1700 by an insert injection molding process. Thus, the mold frame 1600 is integrally formed with the lower receiving container 1700. The mold frame 1600 may include two shorter sides opposing to each other and a longer side connecting the two shorter sides. For example, the mold frame 1600 may be formed as a frame shape formed with three sides. A flexible printed circuit board (refers 310 of FIG. 1) and a light source (refers 300 of FIG. 1) may be disposed at a longer side at which the mold frame 1600 is not formed.

The mold frame 1600 may include a plurality of groove portions H. The mold frame 1600 may be formed on the lower receiving container 1700 by an insert injection molding process. Thus, the mold frame 1600 is integrally formed with the lower receiving container 1700. Without the plurality of groove portions H, when the mold frame 1600 is shrunk after the insert injection molding process, the lower receiving container 1700 may be warped. However, the mold frame 1600 according to the present exemplary embodiment has the groove portion H, so that a warping of the lower receiving container 1700 may be prevented despite the contraction of the mold frame 1600.

The groove portion H may extend vertically with respect to an outer surface of the mold frame 1600. The groove portion H is partially formed in the side wall portion 1610 of the mold frame 1600. That is, the side wall portion 1610 of the mold frame 1600 is not removed entirely. The groove portion H may not expose the bottom portion of the lower receiving container 1700. Thus, the supporting portion 1620 of the mold frame 1600 is not removed entirely in the groove portion H in a plan view.

When the side wall portion 1610 of the mold frame 1600 is removed entirely, a light may be leaked through the groove portion H. Accordingly, a light-leakage or a dark spot may be occurred in a display apparatus. However, the groove portion H according to the present exemplary embodiment is partially formed in the side wall portion 1610 of the mold frame 1600. That is, the side wall portion 1610 of the mold frame 1600 is not removed entirely. Accordingly, an optical path is not formed in the side wall portion 1610 of the mold frame 1600. Therefore, a light-leakage or a dark spot may not be occurred in a display apparatus.

Figure 9:
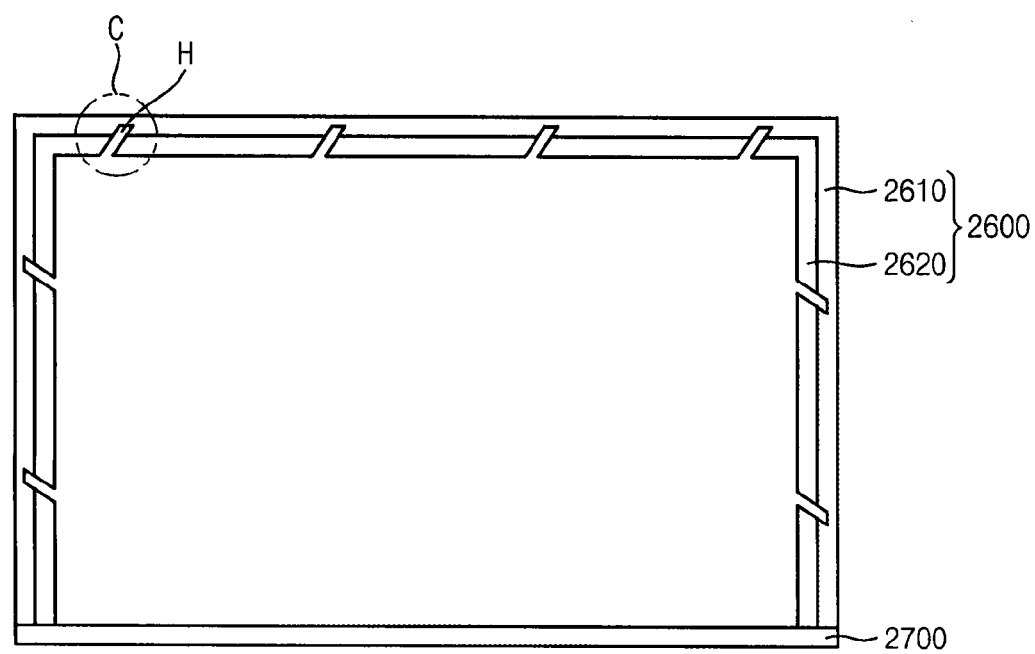
FIG. 9 is a plan view illustrating an exemplary embodiment of mold frame and lower receiving container according to the inventive concept.
Figure 10:
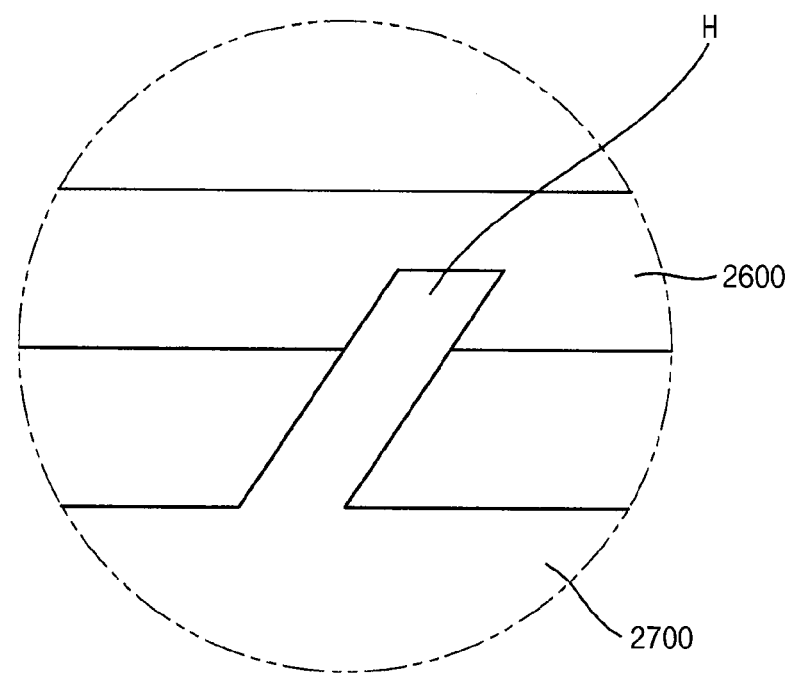
FIG. 10 is a plan view magnifying "C" portion of FIG. 9.

FIG. 9 is a plan view illustrating an exemplary embodiment of mold frame and lower receiving container according to the inventive concept. FIG. 10 is a plan view magnifying "C" portion of FIG. 9.

Referring to FIGS. 9 and 10, the mold frame 2600 according to the present exemplary embodiment may be formed on the lower receiving container 2700 by an insert injection molding process. Thus, the mold frame 2600 is integrally formed with the lower receiving container 2700. The mold frame 2600 may include two shorter sides opposing to each other and a longer side connecting the two shorter sides. For example, the mold frame 2600 may be formed as a frame shape formed with three sides. A flexible printed circuit board (refers 310 of FIG. 1) and a light source (refers 300 of FIG. 1) may be disposed at a longer side at which the mold frame 2600 is not formed.

The mold frame 2600 may include a plurality of groove portions H. The mold frame 2600 may be formed on the lower receiving container 2700 by an insert injection molding process. Thus, the mold frame 2600 is integrally formed with the lower receiving container 2700. Without the plurality of groove portions H, when the mold frame 2600 is shrunk, the lower receiving container 2700 may be warped. However, the mold frame 2600 according to the present exemplary embodiment has the groove portion H, so that a warping of the lower receiving container 2700 may be prevented despite the contraction of the mold frame 2600.

The groove portion H may have a predetermined angle of inclination with respect to an outer surface of the mold frame 2600. The groove portion H is partially formed in the side wall portion 2610 of the mold frame 2600. That is, the side wall portion 2610 of the mold frame 2600 is not removed entirely. The groove portion H may expose the bottom portion of the lower receiving container 2700. Thus, the supporting portion 2620 of the mold frame 2600 is removed entirely in the groove portion H in a plan view.

When the side wall portion 2610 of the mold frame 2600 is removed entirely, a light may be leaked through the groove portion H. Accordingly, a light-leakage or a dark spot may be occurred in a display apparatus. However, the groove portion H according to the present exemplary embodiment is partially formed in the side wall portion 2610 of the mold frame 2600. That is, the side wall portion 2610 of the mold frame 2600 is not removed entirely. Accordingly, an optical path is not formed in the side wall portion 2610 of the mold frame 2600. Therefore, a light-leakage or a dark spot may not be occurred in a display apparatus.

Figure 11:
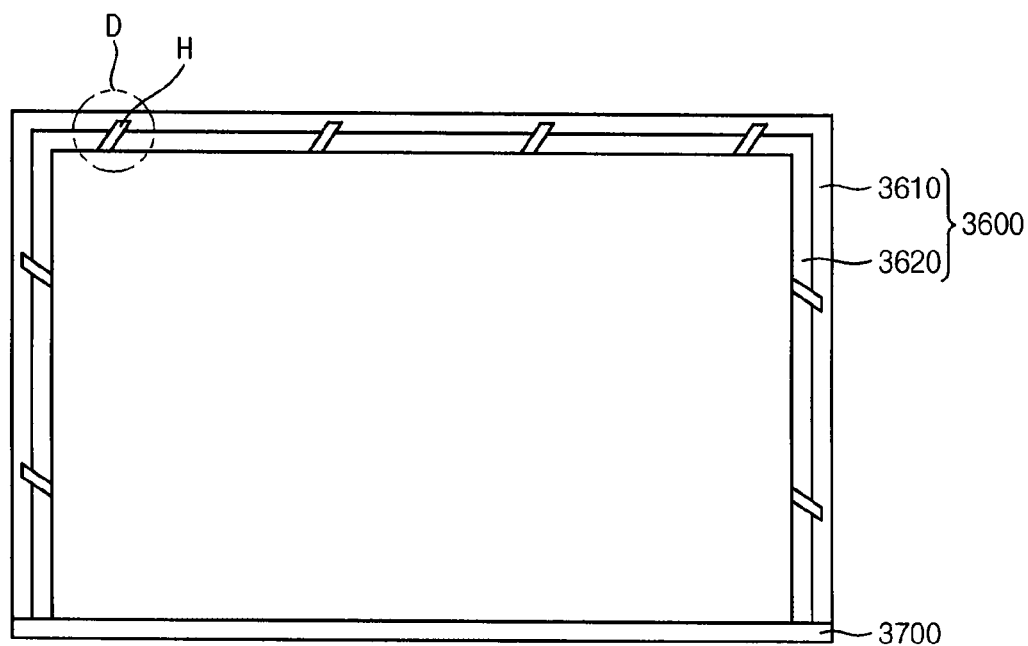
FIG. 11 is a plan view illustrating an exemplary embodiment of mold frame and lower receiving container according to the inventive concept.
Figure 12:
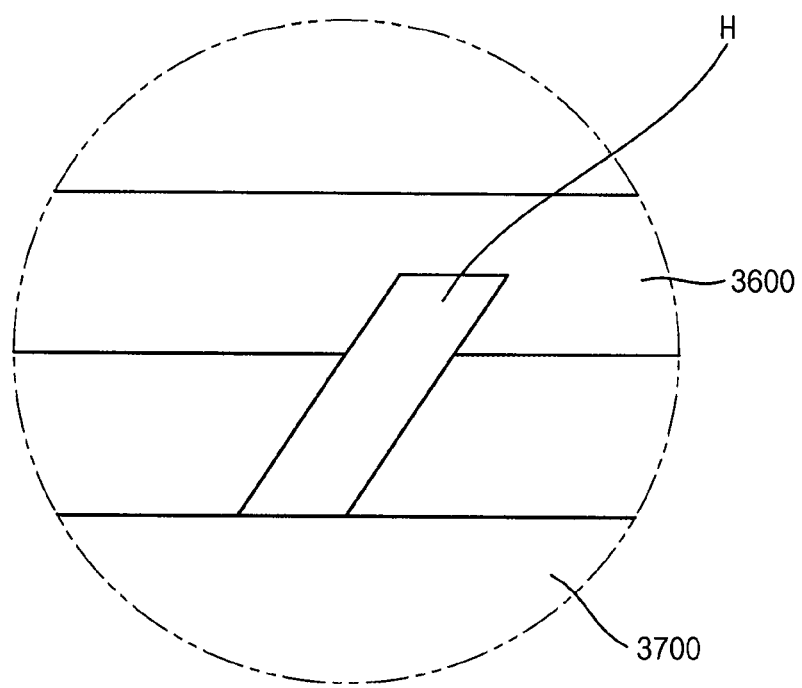
FIG. 12 is a plan view magnifying "D" portion of FIG. 11.

FIG. 11 is a plan view illustrating an exemplary embodiment of mold frame and lower receiving container according to the inventive concept. FIG. 12 is a plan view magnifying "D" portion of FIG. 11.

Referring to FIGS. 11 and 12, the mold frame 3600 according to the present exemplary embodiment may be formed on the lower receiving container 3700 by an insert injection molding process. Thus, the mold frame 1600 is integrally formed with the lower receiving container 3700. The mold frame 3600 may include two shorter sides opposing to each other and a longer side connecting the two shorter sides. For example, the mold frame 3600 may be formed as a frame shape formed with three sides. A flexible printed circuit board (refers 310 of FIG. 1) and a light source (refers 300 of FIG. 1) may be disposed at a longer side at which the mold frame 3600 is not formed.

The mold frame 3600 may include a plurality of groove portions H. The mold frame 3600 may be formed on the lower receiving container 3700 by an insert injection molding process. Thus, the mold frame 3600 is integrally formed with the lower receiving container 3700. Without the plurality of groove portions H, when the mold frame 3600 is shrunk, the lower receiving container 3700 may be warped. However, the mold frame 3600 according to the present exemplary embodiment has the groove portion H, so that a warping of the lower receiving container 3700 may be prevented despite the contraction of the mold frame 3600.

The groove portion H may have a predetermined angle of inclination with respect to an outer surface of the mold frame 3600. The groove portion H is partially formed in the side wall portion 3610 of the mold frame 3600. That is, the side wall portion 3610 of the mold frame 3600 is not removed entirely. The groove portion H may not expose the bottom portion of the lower receiving container 3700. Thus, the supporting portion 3620 of the mold frame 3600 is not removed entirely in the groove portion H in a plan view.

When the side wall portion 3610 of the mold frame 3600 is removed entirely, a light may be leaked through the groove portion H. Accordingly, a light-leakage or a dark spot may be occurred in a display apparatus. However, the groove portion H according to the present exemplary embodiment is partially formed in the side wall portion 3610 of the mold frame 3600. That is, the side wall portion 3610 of the mold frame 3600 is not removed entirely. Accordingly, an optical path is not formed in the side wall portion 3610 of the mold frame 3600. Therefore, a light-leakage or a dark spot may not be occurred in a display apparatus.

Figure 13:
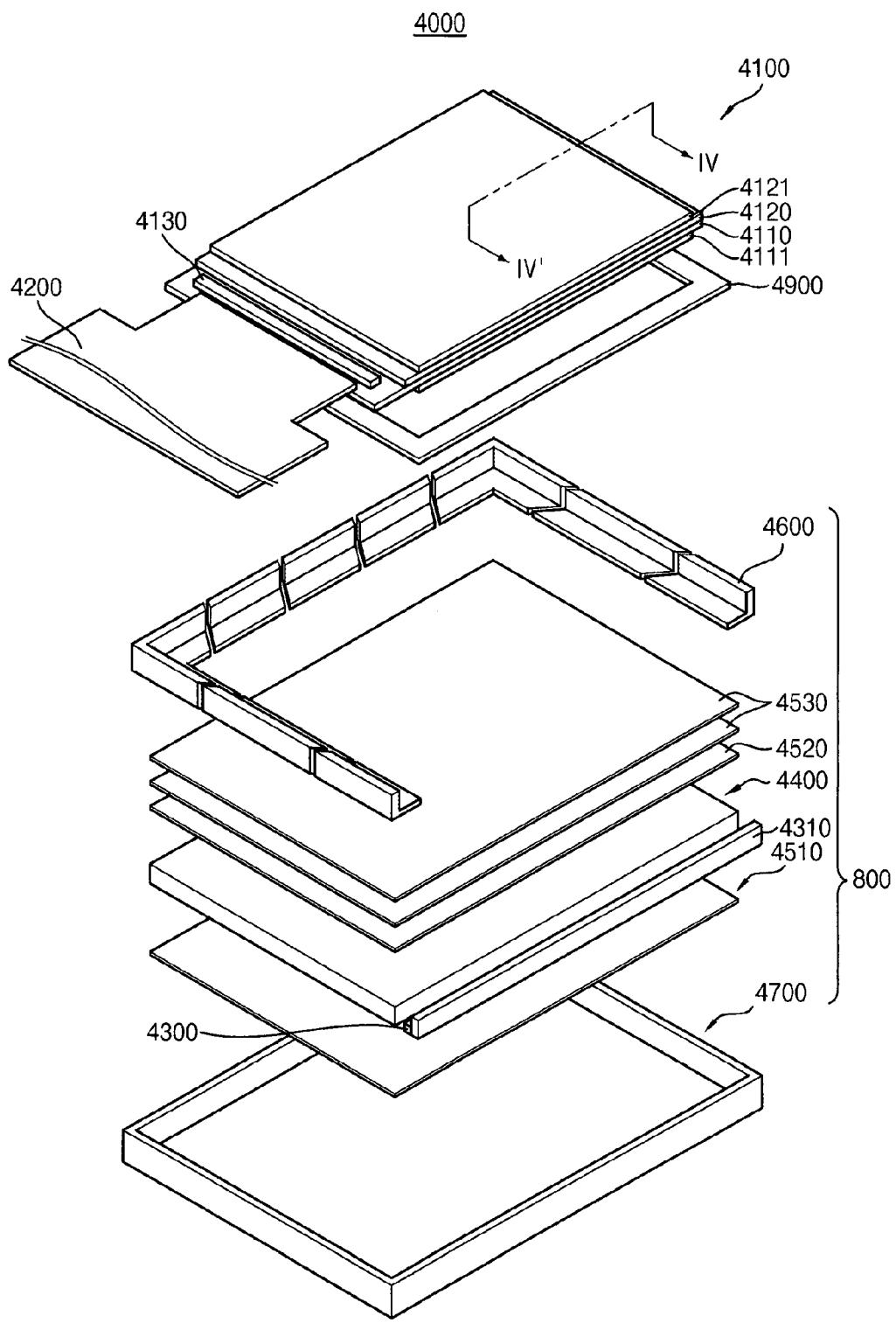
FIG. 13 is an exploded perspective view illustrating an exemplary embodiment of display apparatus according to the inventive concept.
Figure 14:
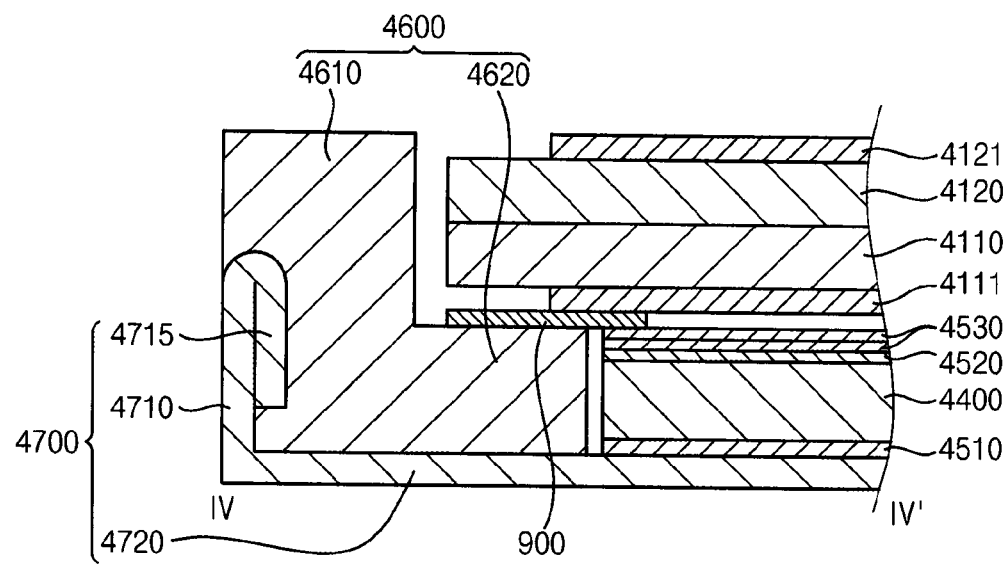
FIG. 14 is a cross-sectional view taken along line IV-IV' of FIG. 13.

FIG. 13 is an exploded perspective view illustrating an exemplary embodiment of display apparatus according to the inventive concept. FIG. 14 is a cross-sectional view taken along line IV-IV' of FIG. 13.

Referring to FIGS. 13 and 14, a display apparatus 4000 according to an exemplary embodiment of the inventive concept includes a display panel 4100 displaying an image, a main flexible printed circuit board 4200 electrically connected to the display panel 4100 and a backlight assembly 4800 supplying light to the display panel 4100.

The display panel 4100 includes a first substrate 4110, a second substrate 4120 facing the first substrate 4110, a liquid crystal layer disposed between the first substrate 4110 and the second substrate 4120, a first polarizing film 4111 disposed on a lower surface of the first substrate 4110 and a second polarizing film 4121 disposed on an upper surface of the second substrate 4120. An image is displayed on the display panel 4100 using a light from the backlight assembly 4800.

The first substrate 4110 may include a thin film transistors formed in a matrix configuration. A source electrode of the thin film transistor is electrically connected to a date line. A gate electrode of the thin film transistor is electrically connected to a gate line. A drain electrode of the thin film transistor is electrically connected to a pixel electrode. The pixel electrode may be formed of transparent conductive material. For example, the pixel electrode may include a transparent conductive material, such as indium tin oxide (ITO), indium zinc oxide (IZO), etc. In addition, the pixel electrode may include titanium (Ti) and/or molybdenum titanium (MoTi).

The second substrate 4120 faces the first substrate 4110. The second substrate 4120 may include a color filter that colors the pixel. The second substrate 4120 may include a common electrode. The common electrode may face the pixel electrode. The common electrode may be formed of transparent conductive material. For example, the common electrode may include a transparent conductive material, such as indium tin oxide (ITO), indium zinc oxide (IZO), etc. In addition, the common electrode may include titanium (Ti) and/or molybdenum titanium (MoTi).

When the thin film transistor is turned on by applying turn-on voltage to the gate of the thin film transistor, the electric field is formed between the pixel electrode and the common electrode. The electric field alters an aligning angle of the liquid crystal molecules of the liquid crystal layer disposed between the first substrate 4110 and the second substrate 4120. Thus, a light transmittance of the liquid crystal layer is varied in accordance with the alteration of the aligning angle of the liquid crystal, so a desired image may be displayed on the display apparatus 4000.

The first polarizing film 4111 may be disposed on a lower surface of the first substrate 4110. The first polarizing film 4111 may have a first polarization axis. The first polarizing film 4111 may polarize light in a first direction.

The second polarizing film 4121 may be disposed on an upper surface of the second substrate 4120. The second polarizing film 4121 may have a second polarization axis. The second polarizing film 4121 may polarize light in a second direction crossing the first direction. For example, the first polarization axis may be perpendicular to the second polarization axis.

The display panel 4100 may further include a driving chip 4130. The driving chip 4130 may drive the first substrate 4110. The driving chip 4130 generates a driving signal driving the first substrate 4110 in response to a control signal applied from other elements. In the present exemplary embodiment, the driving chip 4130 may be disposed at an end of the first substrate 4110. For example, the driving chip 4130 may be electrically connected to the first substrate 4110 by a chip on glass (COG) process.

The main flexible printed circuit board 4200 is electrically connected to an end of the first substrate 4110 to apply a control signal to the display panel 4100. For example, the main flexible printed circuit board 4200 may be electrically connected to the first substrate 4110 by a film on glass (FOG) process. In the present exemplary embodiment, the main flexible printed circuit board 4200 is connected to the end of the first substrate 4110 and bent to a lower surface of the display panel 4100. For example, the main flexible printed circuit board 4200 may be formed of a resin having flexibility.

The backlight assembly 4800 is disposed under the display panel 4100. The backlight assembly 4800 includes a light source unit generating light, a mold frame 4600 covering an outside of the light source unit and a lower receiving container 4700 covering an outside of the mold frame 4600 and integrally formed with the mold frame 4600. Although the mold frame 4600 is integrally formed with the lower receiving container 4700, the mold frame 4600 and the lower receiving container 4700 illustrated in FIG. 13 are separated from each other for convenience of explanation.

The light source unit may include a flexible printed circuit board 4310, a light source 4300, a light guide plate 4400 and a plurality of optical sheets.

The flexible printed circuit board 4310 may provide the light source 4300 disposed thereon with driving power. In the present exemplary embodiment, the flexible printed circuit board 4310 may be disposed under the first substrate 4110 to be corresponded to an end of the display panel 4100. For example, the flexible printed circuit board 4310 may be formed of a resin having flexibility. The flexible printed circuit board 4310 may include a metal line disposed thereon.

The light source 4300 may be disposed on the flexible printed circuit board 4310 to generate light. In the present exemplary embodiment, the light source 4300 may be mounted on the flexible printed circuit board 4310. For example, the light source 4300 may include a light emitting diode (LED) emitting a white light. The number of the light sources 4300 may be determined in consideration of size and brightness of the display panel 4100. In the present exemplary embodiment, the flexible printed circuit board 4310 and the light source 4300 may be disposed at an end of the light guide plate 4400.

The light guide plate 4400 may be disposed under the display panel 4100. The light guide plate 4400 may be formed as a plate shape. The light guide plate 4400 may be disposed adjacent to the light source 4300 to face a light exit surface of the light source 4300. The light guide plate 4400 may include a groove (not shown). The light source 4300 is inserted into the groove (not shown), so that a loss of light may be decreased. The light guide plate 4400 guides light emitted from the light source 4300 toward the display panel 4100.

The light guide plate 4400 includes a transparent material to minimize a loss of light from the light source 4300. For example, the light guide plate 4400 may include a material having superior strength, such as polymethylmethacrylate (PMMA).

In order to reduce a thickness of the light guide plate 4400, the light guide plate 4400 may include polycarbonate (PC). The polycarbonate is inferior in strength to the polymethylmethacrylate, but the polycarbonate is superior in heat-resistance to the polymethymethacrylate.

The optical sheets may improve luminance characteristics of light emitted from the light guide plate 4400. The optical sheets may include a reflecting sheet 4510, a diffusion sheet 4520 and a prism sheet 4530.

The reflecting sheet 4510 may be disposed under the light guide plate 4400. The reflecting sheet 4510 reflects light leaked through a lower surface of the light guide plate 4400 back to the light guide plate 4400, so that light efficiency is enhanced.

The diffusion sheet 4520 may be disposed on the light guide plate 4400. The diffusion sheet 4520 may diffuse light exiting from the light guide plate 4400.

The prism sheet 4530 may be disposed on the diffusion sheet 4520. The prism sheet 4530 may condense light exiting from the light guide plate 4400. For example, the prism sheet 4530 may include a vertical prism sheet condensing light in a vertical direction and a horizontal prism sheet condensing light in a horizontal direction.

The mold frame 4600 may enclose the light source unit to expose a lower surface of the light source unit. The mold frame 4600 may be engaged with the display panel 4100 disposed over the light source unit. The mold frame 4600 may include two shorter sides opposing to each other and a longer side connecting the two shorter sides, but not limited thereto. The mold frame 4600 may be formed as a frame shape.

The mold frame 4600 may be formed with a polymer. For example, the mold frame 4600 may include a material having superior strength, such as polymethylmethacrylate (PMMA).

In order to reduce a thickness of the mold frame 4600, the mold frame 4600 may include polycarbonate (PC). The polycarbonate is inferior in strength to the polymethylmethacrylate, but the polycarbonate is superior in heat-resistance to the polymethymethacrylate.

The mold frame 4600 may include a side wall portion 4610 and a supporting portion 4620. The side wall portion 4610 may surround an edge of the display panel 4100. The supporting portion 4620 may extend from the side wall portion 4610 toward in an inner direction of the receiving container 4700. An edge of the display panel 4100 may be disposed on the supporting portion 4620. A height of the supporting portion 4620 may be the same as a height of the light source unit. The supporting portion 4620 may guide and support the edge of the display panel 4100.

The mold frame 4600 according an exemplary embodiment of the inventive concept may be formed by an insert injection molding process. The mold frame 4600 may be integrally formed with the lower receiving container 4700. Thus, the mold frame 4600 and the lower receiving container 4700 may be formed to have a thin thickness.

The mold frame 4600 may include a plurality of sub-mold frames spaced a predetermined distance apart from each other. Each of the plurality of first sub-mold frames has an outer surface extending along the side wall of the lower receiving container 4700 and a cutting surface extending obliquely from the outer surface. The cutting surface faces a cutting surface of an adjacent sub-mold frame. A cutting surface of the sub-mold frame may have a predetermined angle of inclination with respect to an outer surface of the mold frame 4600. A first sub-mold frame may include a first cutting surface facing a second cutting surface of a second sub-mold frame adjacent to the first sub-mold frame. The first cutting surface and the second cutting surface are paralleled to each other.

The mold frame 4600 may be formed on the lower receiving container 4700 by an insert injection molding process. Thus, the mold frame 4600 is integrally formed with the lower receiving container 4700. Accordingly, when the mold frame 4600 is shrunk, the lower receiving container 4700 may be warped. However, the mold frame 4600 according to the present exemplary embodiment has a plurality of sub-mold frames spaced apart from each other, so that a warping of the lower receiving container 4700 may be prevented despite the contraction of the mold frame 4600.

The first cutting surface 4602 and the second cutting surface 4604 may have a predetermined angle of inclination with respect to an outer surface of the mold frame 4600. Thus, the first sub-mold frame and the second sub-mold frame may have an overlapping region "a" in a vertical direction with respect to the outer surface of the mold frame 4600. Accordingly, the overlapping region may block a vertical light with respect to the outer surface of the mold frame 4600. Therefore, a light-leakage or a dark spot may not be occurred in a display apparatus.

The lower receiving container 4700 may accommodate the light source unit. The lower receiving container 4700 may include a material having superior strength, such as metal. For example, the lower receiving container 4700 may be a metal chassis.

The lower receiving container 4700 may be integrally formed with the mold frame 4600. The mold frame 4600 may be formed on the lower receiving container 4700 by an insert injection molding process. After the lower receiving container 4700 is installed in a mold manufacturing apparatus having die, mold forming material is inserted into the die. Thus, the mold frame 4600 may be directly formed on the lower receiving container 4700 with no mechanical joint. When a mold frame and a lower receiving container are manufactured using a conventional method, a gap between the mold frame and the lower receiving container may be generated. However, the mold frame 4600 according to the present exemplary embodiment is directly formed on the lower receiving container 4700, so that a gap between the mold frame and the lower receiving container may be minimized.

The lower receiving container 4700 may include a side portion 4710, a bottom portion 4720 and a bending portion 4715. The bending portion 4715 may be formed on the side wall of the lower receiving container 4700. The bending portion 4715 may enhance an adhesion between the mold frame 4600 and the lower receiving container 4700.

The bending portion 4715 may extend from the side wall of the lower receiving container 4700. The bending portion 4715 is bent toward a bottom portion 4720 of the lower receiving container 4700. For example, the bending portion 4715 may be formed by hemming. The bending portion 4715 may have a "U" shape in a cross-sectional view.

The mold frame 4600 and the lower receiving container 4700 may be integrally formed. For example, a lower surface of the mold frame 4600 may directly contact an upper surface of the bottom portion 4720 of the lower receiving container 4700. An inner surface of the side wall of the lower receiving container 4700 may directly contact a side surface of the mold frame 4600. An upper surface of the wall of the lower receiving container 4700 may be covered with the mold frame 4600.

The bending portion 4715 according to the present exemplary embodiment may enhance an adhesion between the mold frame 4600 and the lower receiving container 4700. Thus, an assembly quality between the mold frame 4600 and the lower receiving container 4700 may be improved.

The display apparatus 4000 may include a bonding sheet 4900. The bonding sheet 4900 may be disposed on the supporting portion 4620 of the mold frame 4600 to be overlapped with an edge of the optical sheet. The bonding sheet 4900 may have a frame shape. The bonding sheet 4900 may bond a lower surface of the display panel 4100 on an upper surface of the supporting portion 4620 of the mold frame 4600. For example, the bonding sheet 4900 may be formed as a double-sided tape.

Figure 15:
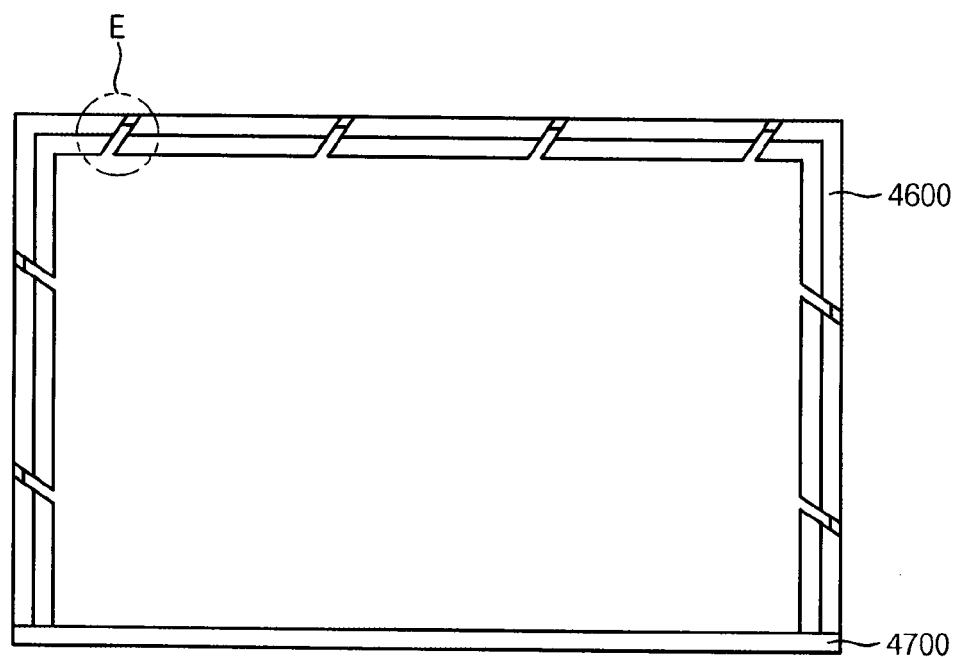
FIG. 15 is a plan view illustrating an exemplary embodiment of mold frame and lower receiving container according to the inventive concept.
Figure 16:
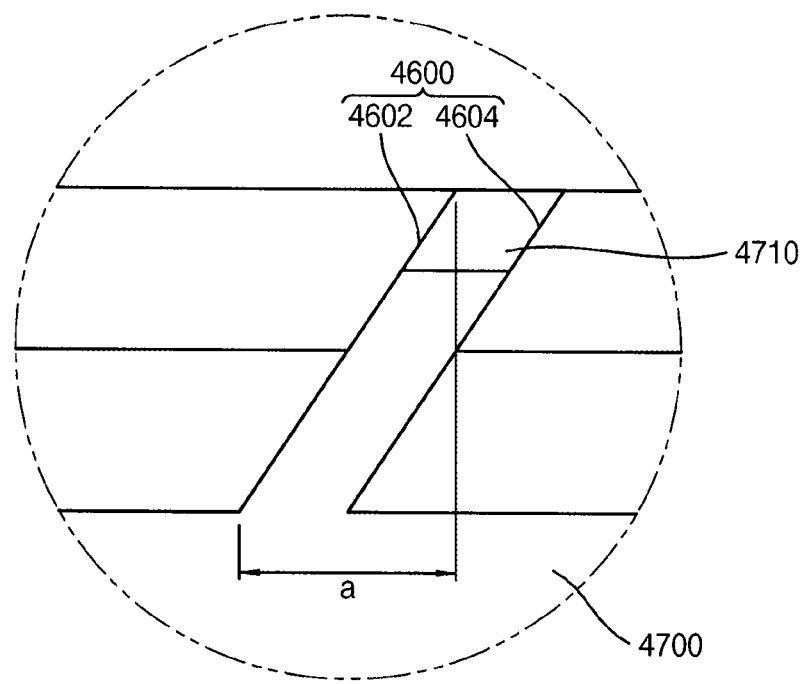
FIG. 16 is a plan view magnifying "E" portion of FIG. 15.

FIG. 15 is a plan view illustrating an exemplary embodiment of mold frame and lower receiving container according to the inventive concept. FIG. 16 is a plan view magnifying "E" portion of FIG. 15.

Referring to FIGS. 15 and 16, the mold frame 4600 according to the present exemplary embodiment may be formed on the lower receiving container 4700 by an insert injection molding process. Thus, the mold frame 4600 is integrally formed with the lower receiving container 4700. The mold frame 4600 may include two shorter sides opposing to each other and a longer side connecting the two shorter sides. For example, the mold frame 4600 may be formed as a frame shape formed with three sides. A flexible printed circuit board (refers 4310 of FIG. 13) and a light source (refers 4300 of FIG. 13) may be disposed at a longer side at which the mold frame 4600 is not formed.

The mold frame 4600 may include a plurality of sub-mold frames spaced apart from each other. The mold frame 4600 may be formed on the lower receiving container 4700 by an insert injection molding process. Thus, the mold frame 4600 is integrally formed with the lower receiving container 4700. Without having the plurality of sub-mold frames, when the mold frame 4600 is shrunk after the insert injection molding process, the lower receiving container 4700 may be warped. However, the mold frame 4600 according to the present exemplary embodiment has a plurality of sub-mold frames spaced apart from each other, so that a warping of the lower receiving container 4700 may be prevented despite the contraction of the mold frame 4600.

The first cutting surface 4602 of a first sub-mold frame and the second cutting surface 4604 of a second sub-mold frame may have a predetermined angle of inclination with respect to an outer surface of the mold frame 4600. Thus, the first sub-mold frame and the second sub-mold frame may have an overlapping region "a" in a vertical direction with respect to the outer surface of the mold frame 4600. Accordingly, the overlapping region may block a vertical light with respect to the outer surface of the mold frame 4600. Therefore, a light-leakage or a dark spot may not be occurred in a display apparatus.

Figure 17:
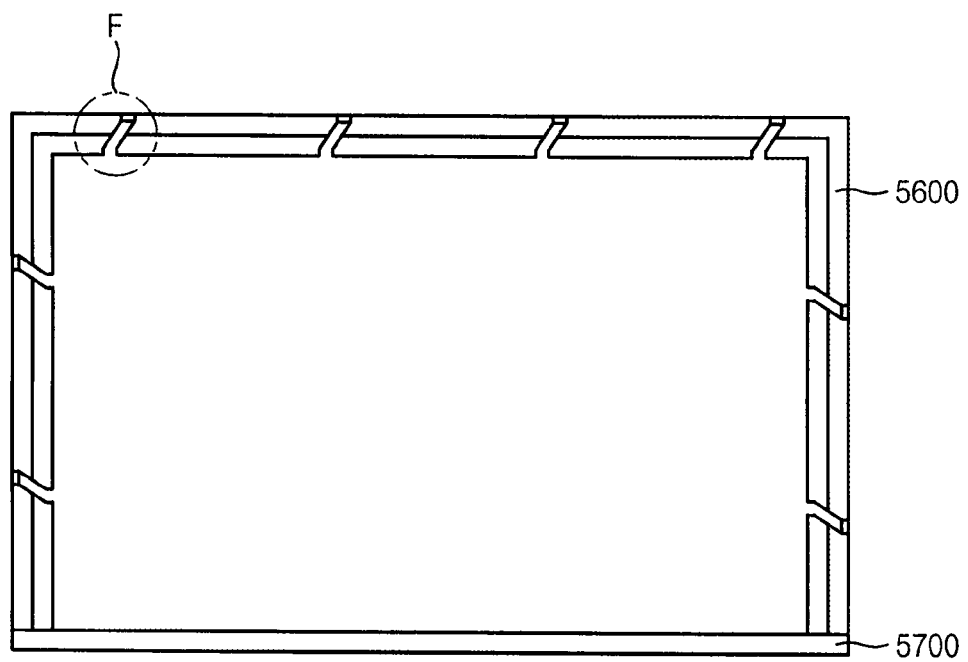
FIG. 17 is a plan view illustrating an exemplary embodiment of mold frame and lower receiving container according to the inventive concept.
Figure 18:
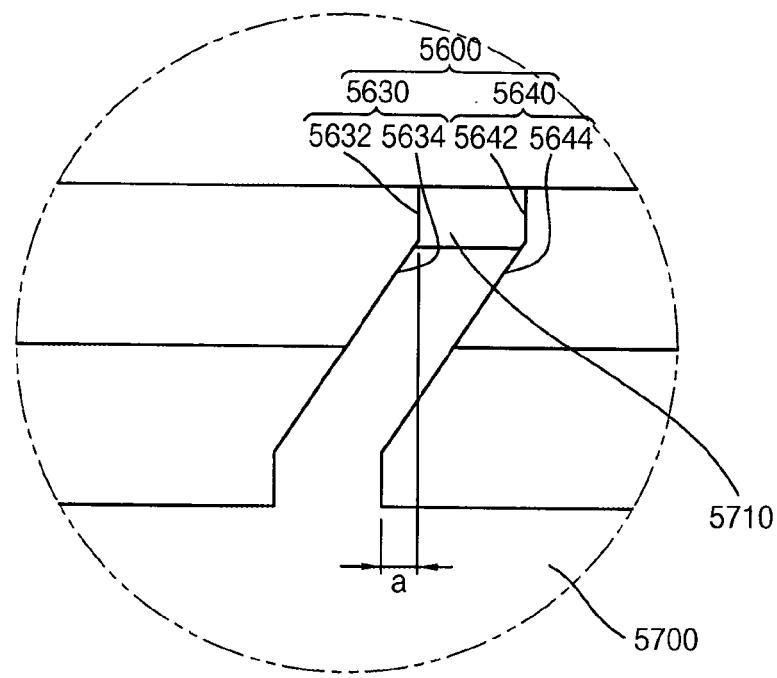
FIG. 18 is a plan view magnifying "F" portion of FIG. 17.

FIG. 17 is a plan view illustrating an exemplary embodiment of mold frame and lower receiving container according to the inventive concept. FIG. 18 is a plan view magnifying "F" portion of FIG. 17.

Referring to FIGS. 17 and 18, the mold frame 5600 according to the present exemplary embodiment may be formed on the lower receiving container 5700 by an insert injection molding process. Thus, the mold frame 5600 is integrally formed with the lower receiving container 5700. The mold frame 5600 may include two shorter sides opposing to 5600 may be formed as a frame shape formed with three sides. A flexible printed circuit board (refers 4310 of FIG. 13) and a light source (refers 4300 of FIG. 13) may be disposed at a each other and a longer side connecting the two shorter sides. For example, the mold frame longer side at which the mold frame 5600 is not formed.

The mold frame 5600 may include a plurality of sub-mold frames spaced apart from each other. The mold frame 5600 may be formed on the lower receiving container 5700 by an insert injection molding process. Thus, the mold frame 5600 is integrally formed with the lower receiving container 5700. Without having the plurality of sub-mold frames, when the mold frame 5600 is shrunk, the lower receiving container 5700 may be warped. However, the mold frame 5600 according to the present exemplary embodiment has a plurality of sub-mold frames spaced apart from each other, so that a warping of the lower receiving container 5700 may be prevented despite the contraction of the mold frame 5600.

The first cutting surface 5630 of a first sub-mold frame and the second cutting surface 5640 of a second sub-mold frame may have a predetermined angle of inclination with respect to an outer surface of the mold frame 5600. The first cutting surface 5630 may include two vertical portions 5632 extending in a vertical direction with respect to the outer surface of the lower receiving container 5700 and an inclined portion 5634 connecting the two vertical portions 5632. The second cutting surface 5640 may include two vertical portions 5642 extending in a vertical direction with respect to the outer surface of the lower receiving container 5700 and an inclined portion 5644 connecting the two vertical portions 5642. Thus, the first sub-mold frame and the second sub-mold frame may have an overlapping region "a" in a vertical direction with respect to the outer surface of the mold frame 5600. Accordingly, the overlapping region may block a vertical light with respect to the outer surface of the mold frame 5600. Therefore, a light-leakage or a dark spot may not be occurred in a display apparatus.

Figure 19:
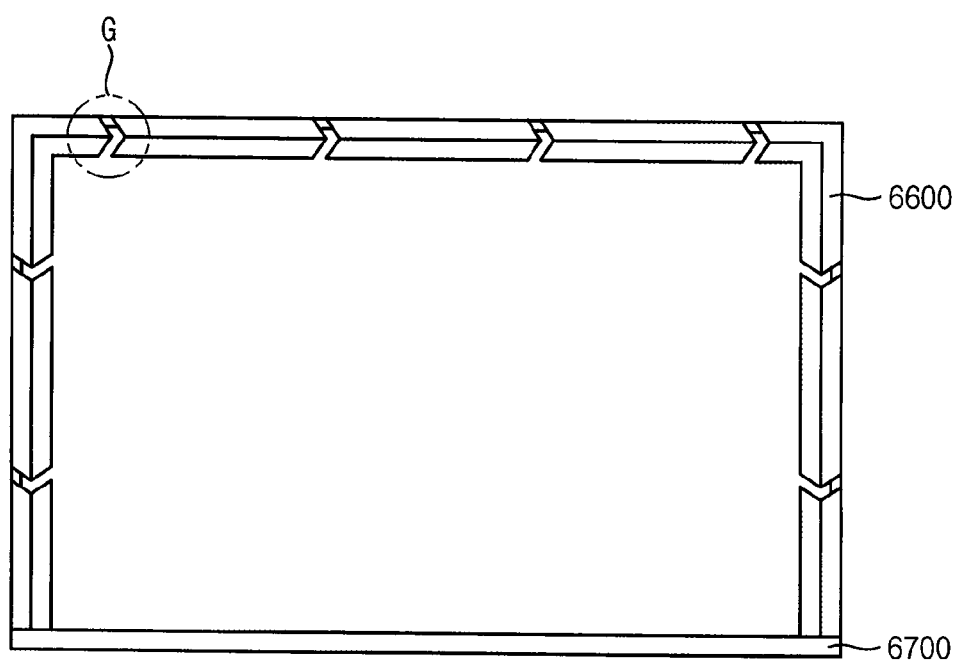
FIG. 19 is a plan view illustrating an exemplary embodiment of mold frame and lower receiving container according to the inventive concept.
Figure 20:
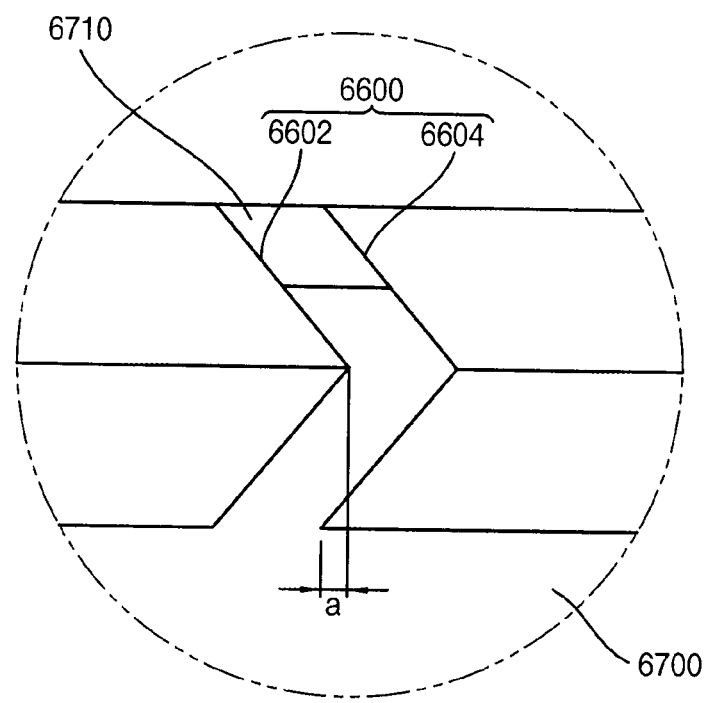
FIG. 20 is a plan view magnifying "G" portion of FIG. 19.

FIG. 19 is a plan view illustrating an exemplary embodiment of mold frame and lower receiving container according to the inventive concept. FIG. 20 is a plan view magnifying "G" portion of FIG. 19.

Referring to FIGS. 19 and 20, the mold frame 6600 according to the present exemplary embodiment may be formed on the lower receiving container 6700 by an insert injection molding process. Thus, the mold frame 6600 is integrally formed with the lower receiving container 6700. The mold frame 6600 may include two shorter sides opposing to each other and a longer side connecting the two shorter sides. For example, the mold frame 6600 may be formed as a frame shape formed with three sides. A flexible printed circuit board (refers 4310 of FIG. 13) and a light source (refers 4300 of FIG. 13) may be disposed at a longer side at which the mold frame 6600 is not formed.

The mold frame 6600 may include a plurality of sub-mold frames spaced apart from each other. The mold frame 6600 may be formed on the lower receiving container 6700 by an insert injection molding process. Thus, the mold frame 6600 is integrally formed with the lower receiving container 6700. Without having the plurality of sub-mold frames, when the mold frame 6600 is shrunk after the insert injection molding process, the lower receiving container 6700 may be warped. However, the mold frame 6600 according to the present exemplary embodiment has a plurality of sub-mold frames spaced apart from each other, so that a warping of the lower receiving container 6700 may be prevented despite the contraction of the mold frame 6600.

The first cutting surface 6602 of a first sub-mold frame and the second cutting surface 6604 of a second sub-mold frame may have a predetermined angle of inclination with respect to an outer surface of the mold frame 6600. Thus, the first sub-mold frame and the second sub-mold frame may have an overlapping region "a" in a vertical direction with respect to the outer surface of the mold frame 4600. Accordingly, the overlapping region may block a vertical light with respect to the outer surface of the mold frame 6600. Therefore, a light-leakage or a dark spot may not be occurred in a display apparatus. The first cutting surface 6602 may have a clamp shape having a bent portion at the center. The second cutting surface 6604 may clamp shape having a bent portion at the center. The first cutting surface 6602 and the second cutting surface 6604 extend parallel to each other. Thus, the first sub-mold frame and the second sub-mold frame may have an overlapping region "a" in a vertical direction with respect to the outer surface of the mold frame 6600. Accordingly, the overlapping region may block a vertical light with respect to the outer surface of the mold frame 6600. Therefore, a light-leakage or a dark spot may not be occurred in a display apparatus.

According to the present inventive concept as explained above, the mold frame according to the present exemplary embodiment has the groove portion, so that a warping of the lower receiving container may be prevented despite the contraction of the mold frame. In addition, the side wall portion of the mold frame is not removed entirely. Accordingly, an optical path is not formed in the side wall portion of the mold frame. Therefore, a light-leakage or a dark spot may not be occurred in a display apparatus.

In addition, the mold frame may include a plurality of sub-mold frames spaced apart from each other, so that a warping of the lower receiving container may be prevented despite the contraction of the mold frame. In addition, a first cutting surface of a first sub-mold frame and a second cutting surface of a second sub-mold frame may have a predetermined angle of inclination with respect to an outer surface of the mold frame. Thus, the first sub-mold frame and the second sub-mold frame may have an overlapping region "a" in a vertical direction with respect to the outer surface of the mold frame. Accordingly, the overlapping region may block a vertical light with respect to the outer surface of the mold frame. Therefore, a light-leakage or a dark spot may not be occurred in a display apparatus. The foregoing is illustrative of the inventive concept and is not to be construed as limiting the inventive concept. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims.

What is claimed is:

1. A display apparatus comprising:
   a display panel configured to display an image;
   a lower receiving container comprising a bottom portion and a side wall, and accommodate the display panel; and
   a mold frame integrally formed with the lower receiving container, extending along the side wall of the lower receiving container, having a side wall portion engaged with the side wall of the lower receiving container and a supporting portion extending from the side wall portion to support the display panel and comprising a plurality of groove portions extending from an inner surface of the mold frame toward an outer surface of the mold frame,
   wherein the side wall portion is partially removed by the plurality of groove portions.

2. The display apparatus of claim 1, wherein the supporting portion has a thick portion and a thin portion, the thin portion being disposed between the groove portion and the bottom portion of the lower receiving container.

3. The display apparatus of claim 2, wherein the groove portions extend substantially perpendicular to the side wall of the lower receiving container.

4. The display apparatus of claim 2, wherein the groove portions extend obliquely from the side wall of the lower receiving container.

5. The display apparatus of claim 1, wherein the groove portion exposes the bottom portion of the lower receiving container.

6. The display apparatus of claim 5, wherein the groove portions extend substantially perpendicular to the side wall of the lower receiving container.

7. The display apparatus of claim 5, wherein the groove portions extend obliquely from the side wall of the lower receiving container.

8. The display apparatus of claim 1, wherein the groove portions extend substantially perpendicular to the side wall of the lower receiving container.

9. The display apparatus of claim 1, wherein the groove portions extend obliquely from the side wall of the lower receiving container.

* * * * *